United States Patent [19]
Kojima et al.

[11] Patent Number: 5,602,784
[45] Date of Patent: Feb. 11, 1997

[54] POWER CONSUMPTION REDUCING CIRCUIT HAVING WORD-LINE RESETTING ABILITY REGULATING TRANSISTORS

[75] Inventors: Makoto Kojima; Yoshitaka Mano, both of Osaka, Japan

[73] Assignee: Matsushita Electronics Corporation, Osaka, Japan

[21] Appl. No.: 528,052

[22] Filed: Sep. 14, 1995

[30] Foreign Application Priority Data

Sep. 16, 1994 [JP] Japan .................................. 6-221579

[51] Int. Cl.$^6$ .............................................. G11C 7/00
[52] U.S. Cl. .............................. 365/189.09; 365/230.03; 365/230.06; 365/238.5
[58] Field of Search ....................... 365/230.06, 230.03, 365/189.09, 238.5

[56] References Cited

U.S. PATENT DOCUMENTS

| | | | |
|---|---|---|---|
| 5,265,052 | 11/1993 | D'Arrigo et al. | 365/230.06 |
| 5,335,205 | 8/1994 | Ogihara | 365/230.06 |
| 5,455,789 | 10/1995 | Nakamura et al. | 365/185.17 |

FOREIGN PATENT DOCUMENTS 3-88195   4/1991   Japan .

Primary Examiner—Son T. Dinh
Attorney, Agent, or Firm—McDermott, Will & Emery

[57] ABSTRACT

In a semiconductor memory device having word-line-resetting ability regulating transistors each placed between the corresponding one of a large number of word lines and the ground, each of the above word-line-resetting-ability regulating transistors is composed of first and second transistors connected in series. During standby, the gate voltage of the above second transistor is controlled to be at a set low value (e.g., a value of about 1 V, which is higher than the threshold voltage of the above resetting-ability regulating transistors by 0.2 to 0.5 V). During the operation of the semiconductor memory device, the gate voltage of the second transistor is controlled to be at a value (e.g., 3.3 V) lower than a value of a power source for row decoders (e.g., 5 V) and higher than the above set low value when the corresponding word line is selected, while it is controlled to be at the above set low value (1 V) when the corresponding word line is not selected. Consequently, a current resulting from a short circuit between a bit line and a word line and flowing from the bit line to the ground through the short-circuited portion and the word line can be suppressed during standby and an operating current flowing during operation can be suppressed, thereby reducing power consumption.

19 Claims, 11 Drawing Sheets

POWER CONSUMPTION REDUCING CIRCUIT HAVING WORD-LINE RESETTING ABILITY REGULATING TRANSISTORS

BACKGROUND OF THE INVENTION

The present invention relates to a semiconductor memory device of dynamic-sensing type such as a dynamic RAM. More particularly, it relates to an improved semiconductor memory device comprising a word-line-resetting-ability regulating transistor.

With the recent development of electric appliances which have been reduced in size as well as in power consumption, lower-power dynamic RAMs have been in increasing demand. In the field of portable information appliances, there have been particularly great demands on low-power dynamic RAMs in which not only a current flowing during operation but also a current flowing during battery backup are reduced, since the commercial values of the information appliances depend on the duration of their continuous operation with a battery. In such a low-power dynamic RAM, circuitry has been designed to suppress an increase in current flowing during standby (standby current) during which the dynamic RAM is out of operation. The standby current is defined as a constantly flowing current resulting from a short circuit incessantly caused between a word line and a bit line by dust or the like, which has been accidentally included in the dynamic RAM in the fabrication process thereof.

As an example of the conventional semiconductor memory device (dynamic RAM) in which an increase in standby current has been suppressed, there has been known one disclosed in Japanese Laid-Open Patent Publication No. 3-88195.

FIG. 9(a) shows a principal portion of the dynamic RAM. FIG. 10 shows a chip on which a short circuit has been caused between a bit line and a word line by dust or the like, which has been accidentally included in the dynamic RAM in the fabrication process thereof.

In FIGS. 9(a) and 10 are shown: a memory cell MC; a pair of bit lines BL and/BL; and a word line WL. When the potential of the word line WL is high, the charges in the memory cell MC are released onto the bit line BL. In the drawings are also shown: a precharging transistor 50 for supplying & precharged potential to the above bit lines BL and/BL; a sense amplifier 51 for amplifying a potential difference (data) between the pair of bit lines BL and/BL; a column switch 52; data lines 53 along which the data on the pair of bit lines BL and/BL that has been amplified by the above sense amplifier 51 is transmitted via the above column switch 52.

The potential of the above word line WL is controlled to be at a set high value φwn (which is Vpp level logic) by a word-line driver T8. while it is controlled to be at a ground value by a word-line-resetting- ability regulating transistor T10'. The above two transistors T8 and T10' are controlled by a row decoder 54, as shown in FIG. 9(a). The row decoder 54 consists of transistors T1 to T7, T30, and T31. The row decoder 54 controls a gate voltage VGLEAK of the word-line-resetting-ability regulating transistor T10' to be at two different values, one during operation and the other during standby. Specifically, as shown in FIG. 9(b), the gate voltage VGLEAK of the word-line-resetting-ability regulating transistor T10' is controlled to be at a value VPP during operation during which the transistor T30 is ON and to be at a set value VTT during standby during which the transistor T30 is OFF. The above voltage VPP corresponds to a power-source voltage for driving the row decoder 54. The above set voltage VTT is lower than the above power-source voltage VPP.

A description will be given to the operation of the above conventional embodiment in which, even when an access is made to a faulty address at which a short circuit has occurred between a bit line and a word line, a redundant circuit replaces a defective block containing the faulty address with a redundant block such that correct data in the redundant block is accessed.

During standby, all the bit lines BL and/BL are precharged to a bit-line precharged potential via the precharging transistor 50 in preparation for the subsequent operation. On the other hand, the word line WL is at the ground potential via the word-line-resetting-ability regulating transistor T10' so as to cut off a transfer gate between the bit line BL and the memory cell MC. In this state with no voltage application, if a short circuit has been caused between a bit line and a word line by the particle of dust R shown in the drawing, the precharged potential is allowed to flow as a standby current from the bit-line precharging transistor 50 to the ground by sequentially passing through the precharged bit line BL, dust R, word line WL, and word-line-resetting-ability regulating transistor T10'. In this path, since the gate voltage VGLEAK of the word-line-resetting-ability regulating transistor 10' is at the set low value VTT (e.g., on the order of 1 V slightly higher than the threshold voltage of the transistor T10'), the word-line-resetting-ability regulating transistor T10' is brought into a high-impedance state, so that the above standby current is limited to a sufficiently small value of about 10 μA or less. In the case of not limiting the gate voltage VGLEAK to the low value VTT, the magnitude of the standby current becomes several hundreds of μA, so that an increase in standby current resulting from a short circuit between a bit line and a word line is effectively suppressed by the word-line-resetting-ability regulating transistor T10' in the high-impedance state.

However, although the standby current resulting from a short circuit can be limited to a small value in the above conventional semiconductor memory device, the present inventors have found that an operating current having a large value flows disadvantageously during operation in the above conventional semiconductor memory device.

Specifically, as described above, the gate voltage VGLEAK of the word-line-resetting-ability regulating transistor T10' receives a chip activate signal (/RAS signal in a dynamic RAM) during operation and shifts to the logical High level of the row decoder circuit (the power-source voltage Vcc or an internal increased power-source voltage Vpp which ensures operation with a low voltage), thereby enhancing the word-line resetting ability of the word-line-resetting-ability regulating transistor T10'. Here, by way of example, a consideration will be given to a 16-Mbit general-purpose dynamic RAM (4 bits×4 megawords, 2048 refresh cycles). In this case, the number of actual word lines is 8192 to each one of which the above word-line-resetting-ability regulating transistor T10' is connected. The number of the word-line-resetting-ability regulating transistors T10' differs depending on the structure of the semiconductor integrated circuit. However, since the row decoder is normally disposed at the center of the chip, the number of the word-line-resetting-ability regulating transistors T10' becomes double the number of the word lines. If it is assumed that the word-line-resetting-ability regulating transistor T10' has a channel width of 2 μm and a channel length of 1 μm, the capacitance thereof will reaches 70 pF if calculated on the assumption that the gate oxide film is 14 nm thick. If the current flowing from the short-circuited portion is to be limited to about 10 μA or lower in the word-line-resetting-ability regulating transistor T10' of this size, it is necessary to reduce the gate voltage VGLEAK to about 10 μA or lower, as described above. On the foregoing assumption, if the cycle time during operation is 90 ns and Vpp level is 5 V, the on-chip current from the power source (which does not ensure operation with a low voltage) is calculated to reach 3 mA, since the word-line resetting ability of the word-line-resetting-ability regulating transistor T10' becomes higher than that during standby.

In the case of ensuring operation with a low voltage (e.g., 3.3 V), an internal increased-voltage power source is used as the power source for the above row decoder. The internal increased-voltage power source can be obtained by raising the power-source voltage to the increased voltage Vpp, which is high in potential (e.g., about 5 V), by means of an on-chip charge pump. However, since the efficiency with which the internal increased power-source voltage Vpp is generated is generally as low as about 50%, a power-source current flowing during operation reaches a higher value of about 6 mA.

Thus, in the conventional semiconductor memory device, although the standby current can be limited to the order of 10 μA or lower even when there is an on-chip short circuit between a bit line and a word line, the power-source current during operation is considerably increased to the order of 3 mA or 6 mA, depending on the circuit structure. As a result, with portable appliances using a battery as a power source, the duration of their continuous operation is disadvantageously reduced.

Another problem of the conventional semiconductor memory device lies in a generating circuit of the voltage VGLEAK (equal to the low voltage VTT) applied to the gate of the word-line-resetting-ability regulating transistor T10' during standby.

Specifically, the above low-voltage generating circuit is composed of, e.g., a P-channel transistor and a diode-connected N-channel transistor, which have been connected in series between an external power source and the ground, so that a low voltage of about 1 V can be obtained from an intermediate node of the series circuit. However, since a through current flowing through the series circuit is increased if the above P-channel transistor is composed of a transistor having a low impedance, the P-channel transistor should be composed of a transistor having a high impedance, thereby reducing the above through current flowing through the series circuit to several μA or lower. However, if the low-voltage generating circuit of this structure is used, a battery back-up current (such as a slow refresh current or a self-refresh current) for holding data with a battery cannot be suppressed effectively.

The above problem will be described more specifically. Although slow refreshing and self-refreshing are slightly different from each other in their cycles and operating manners, they refer to basically the same mode with intermittent operating states, in which a standby state lasting for 30 to several 100 μs is followed by a single refreshing operation and then the standby state lasting for 30 to several 100 μs takes place again, thereby holding data with low power. If it is assumed that the above low-voltage generating circuit is a simple series circuit composed of the P-channel transistor having a high impedance and an N-channel MOS transistor having been diode-connected to the ground, the output terminal of tile low-voltage generating circuit is connected to the gate of the word-line-resetting-ability regulating transistor, as described above. so that the voltage of the gate requires a long period of time on the order of several tens of μs to lower from the potential level of the power source for the row decoder to the potential level of the low voltage VTT (about 1 V) immediately after the completion of the chip activate signal. Consequently, a comparatively large number of periods during which the gate potential of the word-line-resetting-ability regulating transistor is higher than the low-voltage level of VTT are observed in the intermittent mode such as the slow refreshing mode or the self-refreshing mode. As a result, the state in which the word-line-resetting-ability regulating transistor has a low impedance lasts for a comparatively long period of time and hence the standby current resulting from a short circuit between a bit line and a word line is not effectively suppressed, so that a large amount of battery back-up current (slow refresh current or self-refresh current) is disadvantageously consumed.

SUMMARY OF THE INVENTION

An object of the present invention, which has been achieved in order to overcome the above problems of the conventional embodiment, is to reduce the power consumption of a semiconductor memory device during operation, wherein a standby current resulting from a short circuit between a bit line and a word line is suppressed by means of a word-line-resetting-ability regulating transistor as described above.

Another object of the present invention is to reduce a current (battery back-up current) in an intermittent operation such as slow refreshing or self-refreshing in the above semiconductor memory device.

To attain the above objects, the present invention controls the word-line-resetting ability during operation to be higher than that during standby but lower than that during conventional operation by using a power source in a system different from that of a power source for the row decoder as a driving power source (power source for generating the gate voltage VGLEAK) for the word-line-resetting-ability adjusting transistors.

The present invention also constitutes the low-voltage generating circuit such that, even in an intermittent operating mode such as a slow refreshing operation or a self-refreshing operation, the period required by the gate voltage VGLEAK to return to a given low voltage level at the completion of operation is limited to about several 10 ns or less, thereby reducing the back-up current.

Specifically, a semiconductor memory device of the present invention comprises: a large number of word lines for individually activating a large number of memory cells arranged in a matrix; a large number of bit lines onto which data is read from the above individual memory cells; row decoders, word-line drivers, and word-line-resetting-ability regulating transistors, each for controlling respective voltages of the above word lines; a first power source serving as a power source for the above row decoders; a second power source having a voltage lower than a voltage of the above first power source; and a low-voltage power source for generating a voltage lower than the respective voltages of the above first and second power sources, wherein each of the above word-line-resetting-ability regulating transistors is placed between the corresponding word line and the ground, the above semiconductor memory device further comprising a resetting-ability control circuit for controlling a gate voltage of each of the above word-line-resetting-ability regulating transistors such that it is switched between the voltage of the above second power source and a voltage of the above low-voltage power source, the above gate voltage determining a resetting ability of each of the above word-line-resetting-ability regulating transistors to connect the corresponding word line to the ground.

Alternatively, the semiconductor memory device of the present invention comprises: a large number of word lines for individually activating a large number of memory cells arranged in a matrix; a large number of bit lines onto which data is read from the above individual memory cells; row decoders, word-line drivers, and word-line-resetting-ability regulating transistors, each for controlling respective voltages of the above word lines; a first power source serving as a power source for the above row decoders; and a low-voltage power source for generating a voltage lower than a voltage of the above first power source, wherein each of the above word-line-resetting-ability regulating transistors is placed between the corresponding word line and the ground and a gate voltage of each of the above word-line-resetting-ability regulating transistors is switched between an output signal from the above row decoder having a voltage of the above first power source and a voltage of the above low-voltage power source, the above gate voltage determining a resetting ability of each of the above word-line-resetting-ability regulating transistors to connect the corresponding word line to the ground, the above low-voltage power source having a power source having a high impedance for generating a set low voltage at an output terminal and a charge withdrawing circuit which is activated during a set period after the activation of one of the above memory cells was completed and which reduces the potential of the above output terminal to the above set low voltage.

With the above structures, since the gate voltage of each of the word-line-resetting-ability regulating transistors during operation is controlled to be at the voltage value of the power source other than the power source for the row decoder (first power source). i.e., the voltage value of the second power source lower than that of the first power source in the present invention, the word-line-resetting-ability regulating transistor has a slightly lower impedance than in the case where the gate voltage thereof is controlled to be at the voltage value of the power source for the row decoder. As a result, the word-line resetting ability thereof is reduced accordingly, so that a current flowing from the short-circuited portion of a word line and a bit line to the ground is reduced, resulting in lower power consumption.

Moreover, in the present invention, although the voltage during operation flows into the lower-voltage power source during the set period after the completion of activating the memory cells, the charge withdrawing circuit is activated and the potential of the output terminal of the above low-voltage power source is thereby swiftly reduced, which immediately brings the word-line-resetting-ability regulating transistors into a high-impedance state. Consequently, the current resulting from a short circuit between a bit line and a word line is reduced, so that, even in the intermittent mode such as the slow refreshing mode or the self-refreshing mode, the back-up current uselessly flowing in the intermittent mode is effectively reduced.

The above objects and novel features of the present invention will be more apparent from the reading of the following description in conjunction with the accompanying drawings.

BRIEF DESCRIPTION OF THE DRAWINGS

The accompanying drawings illustrate the preferred embodiments of the present invention.

In the drawings.

DETAILED DESCRIPTION OF THE INVENTION

Below, the preferred embodiments of the present invention will be described with reference to the drawings.
(First Embodiment)

Figure 1:
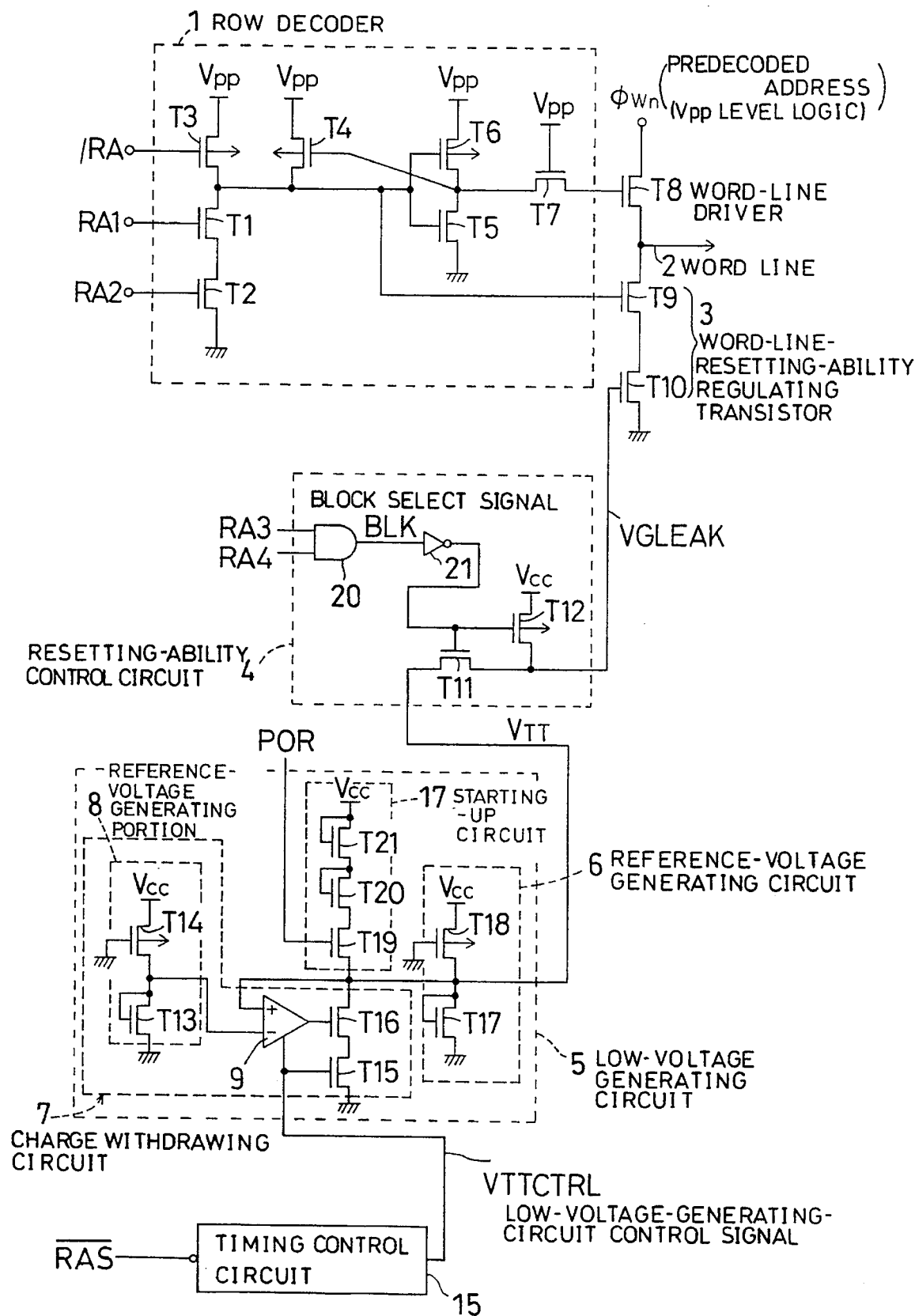
FIG. 1 is a circuit diagram showing the periphery of a row decoder of a semiconductor memory device according a first embodiment of the present invention.
Figure 2:
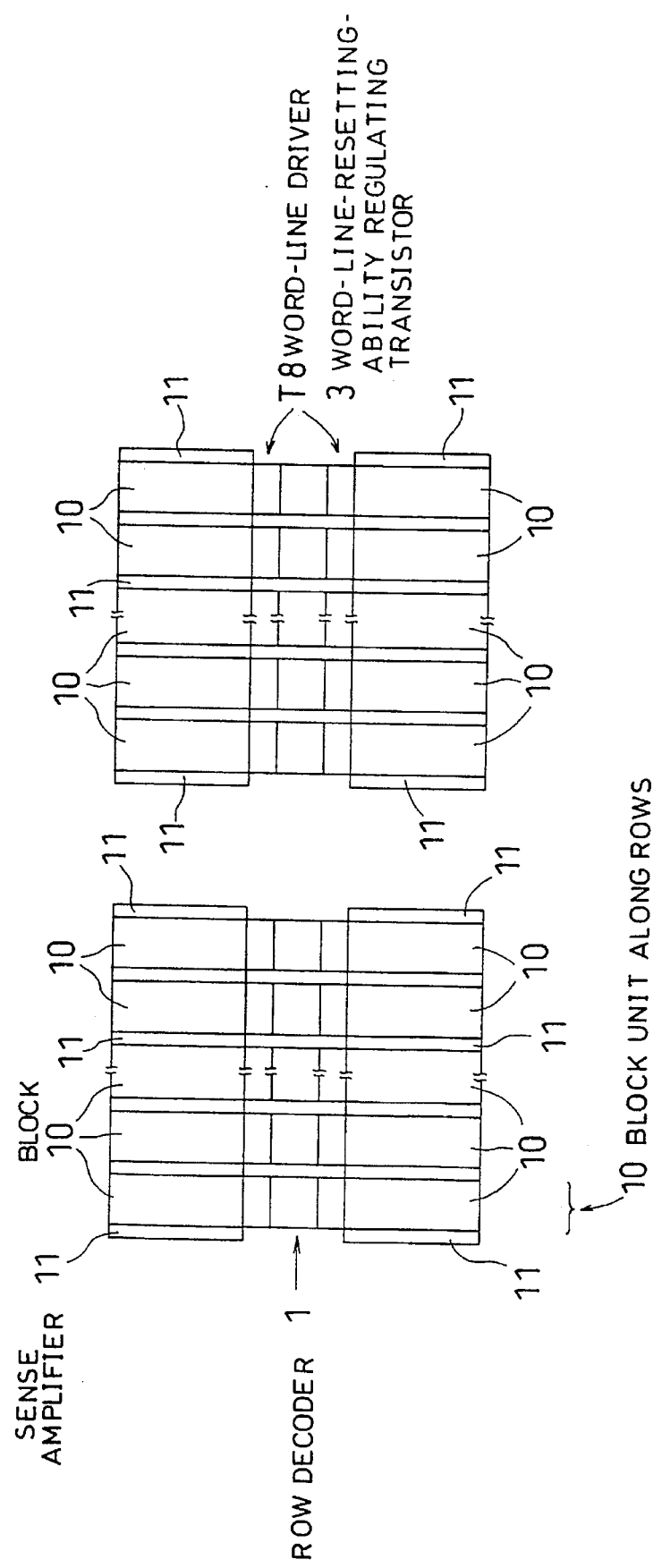
FIG. 2 is a view schematically showing the overall structure of the semiconductor memory device of the first embodiment.
Figure 3:
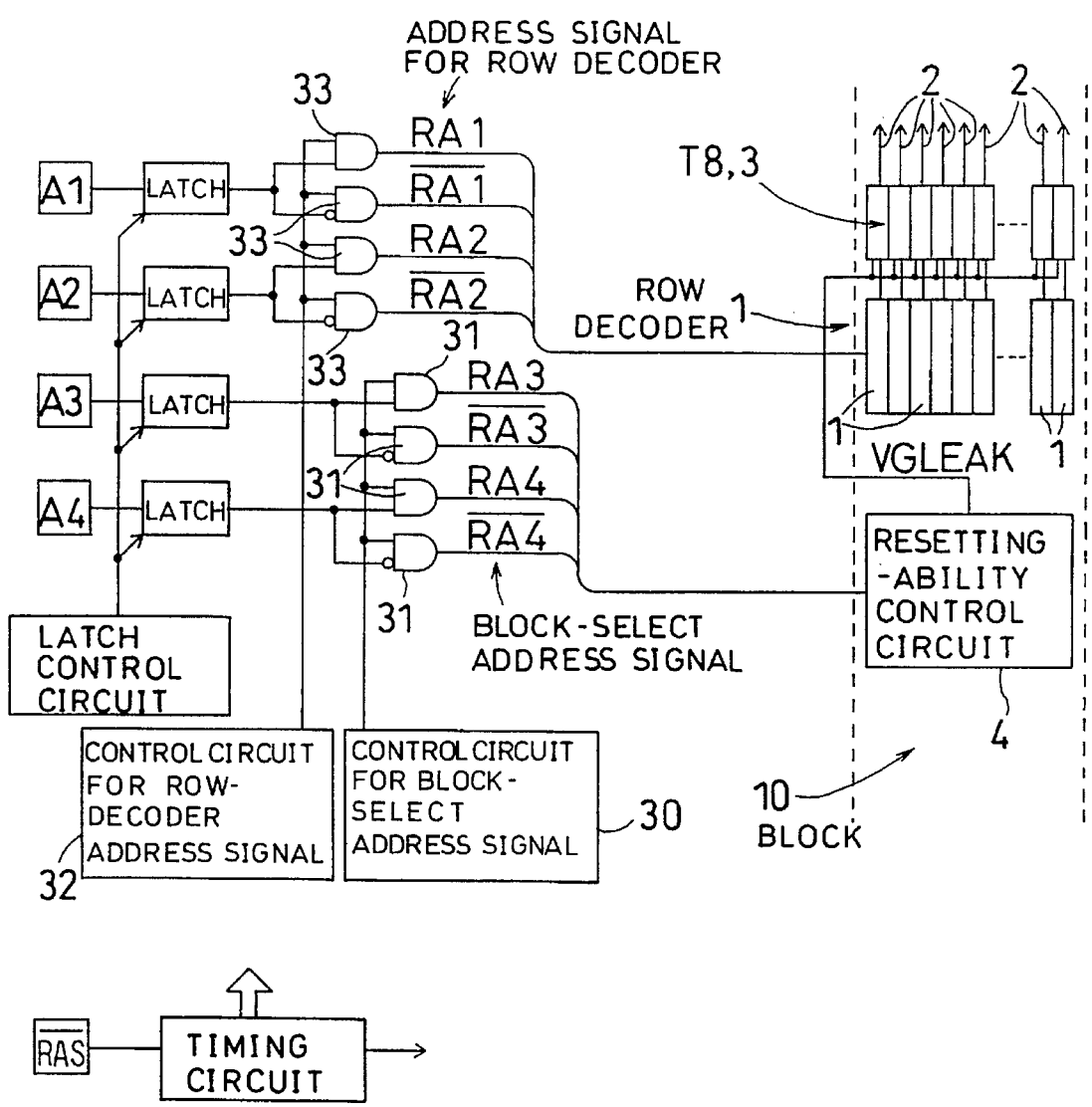
FIG. 3 is a view structurally showing the generation of a block-select address signal of the first embodiment.
Figure 4:
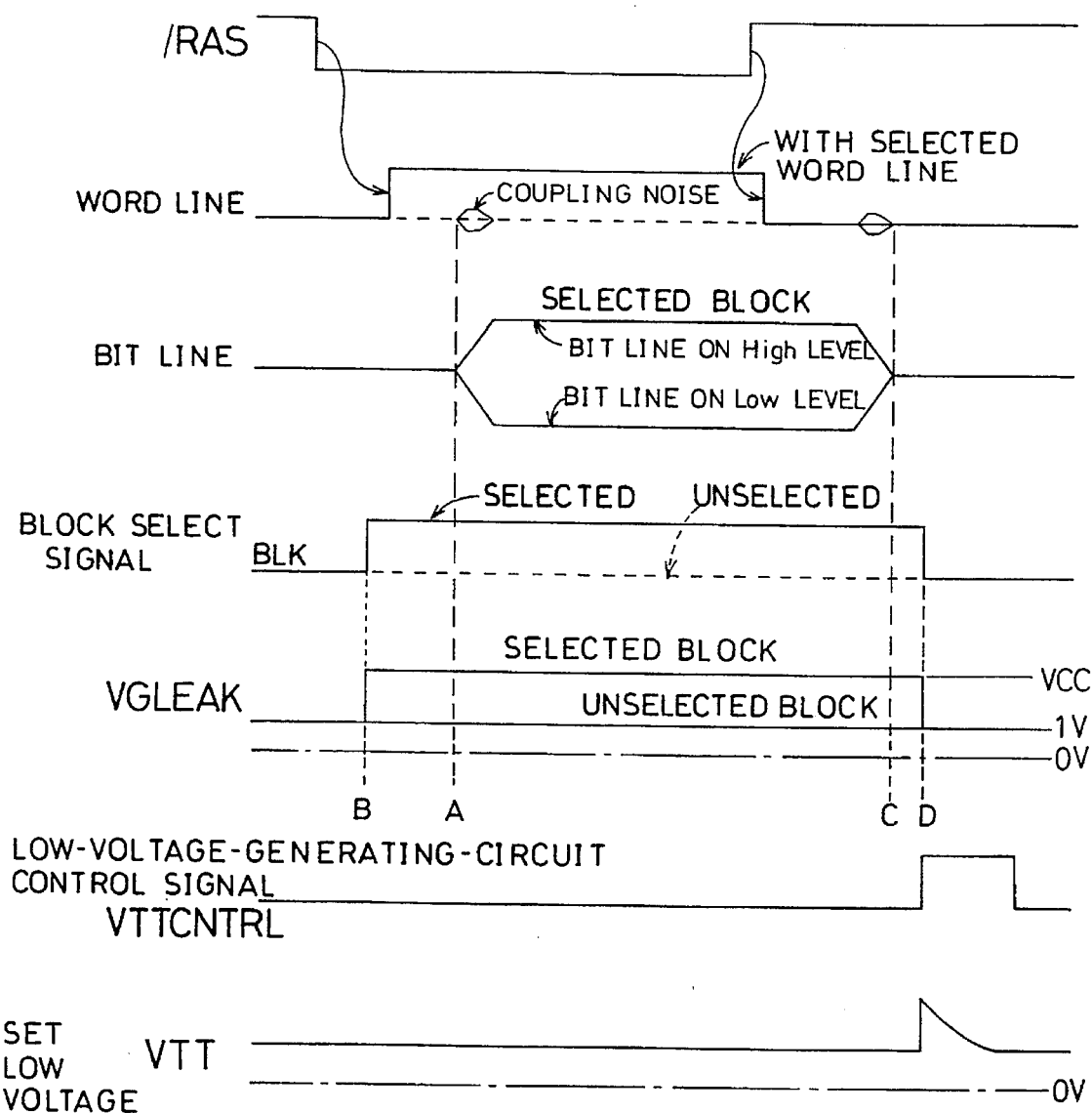
FIG. 4 is a view showing a timing chart in the first embodiment.

FIG. 1 shows the overall structure of a semiconductor memory device according to a first embodiment of the present invention. FIG. 2 shows the structure of a principal portion of the semiconductor memory device of FIG. 1. FIG. 3 shows in detail tile structure of FIG. 2. FIG. 4 shows a timing chart.

In FIG. 1 are shown: a row decoder 1 operating with an increased voltage Vpp from an internal increased-voltage power source (first power source) (not shown); transistors T1 to T7 constituting the above row decoder; a word line 2; a word-line driver T8 composed of a transistor; and a word-line-resetting-ability regulating transistor 3. The above word-line-resetting-ability regulating transistor 3 is composed of a first transistor T9 and a second transistor T10 connected in series between the above word line 2 and the ground.

In the above row decoder 1, if address signals RA1 and RA2 are inputted during operation (i.e., on the inputting of an activate signal/RAS) and the word line 2 corresponding thereto is selected, the transistor T6 is turned ON, which then turns on the word-line driver T8 via the transistor T7, thereby supplying a set high potential φwn to the word line 2. On the other hand, if the address signals RA1 and RA2 are not inputted and the word line 2 corresponding thereto is not selected, the word-line driver T8 is turned OFF, while supplying the increased-voltage potential Vpp to the first transistor T9 of the word-line-resetting-ability regulating transistor 3, thereby turning ON the transistor T9. Thus, if the word line 2 is not selected, the second transistor T10 of the word-line-resetting-ability regulating transistor 3 regulates the ability to connect the potential of the word line 2 to the ground (resetting ability).

In FIG. 1 are also shown: a resetting-ability control circuit 4 having an output terminal connected to the gate of the second transistor T10 of the above word-line-resetting-ability regulating transistor 3; and a low-voltage generating circuit (low-voltage power source) 5 for generating a set low voltage VTT on the order of 1 V, which is higher than the threshold voltage of the transistor by about 0.2 to 0.5 V.

FIG. 2 shows an example of the layout of the above individual circuit elements, in which are shown: blocks 10 formed by dividing, into a plurality of regions, a region around word lines perpendicular to a bit line in sensing operation; and sense amplifiers 11 provided to correspond to the individual blocks 1. The above word-line dreivers T8 and word-line-resetting-ability regulating transistors T3 shown in FIG. 1 are disposed in the central position of a chip to correspond to the individual blocks 10 in FIG. 2.

As shown in FIG. 3, a large number of word-line drivers T8 and word-line-resetting-ability regulating transistors 3, each shown in FIG. 1, are alternately arranged in the direction perpendicular to tile word lines in one block 10, while a large number of row decoders 1 are arranged in the same direction (in FIG. 3, only four address buffers 33 corresponding to row decoders 1 are shown for convenience' sake). For each pair of upper and lower blocks 10, one resetting-ability control circuit 4 shown in FIG. 1 is provided so as to cegulate the word-line resetting abilities of the word-line-resetting-ability regulating transistors 3.

Next, the resetting-ability control circuit 4 and low-voltage generating circuit 5 shown in FIG. 1 will be described in greater detail with reference to FIG. 1.

In the above resetting-ability control circuit 4, Vcc represents the voltage of a 3.3 V power source, a voltage of a power source (second power source) reduced to 3.3 V, or respective voltages of two second power sources, one of which is a 3.3 V power source and the other of which is a power source having a voltage reduced to 3.3 V. The power source Vcc is different from the increased-voltage power source for the above row decoder 1 having a voltage increased by an internal charge pump. Block-select address signals RA3 and RA4 are inputted to an AND circuit 20 from which a block select signal BLK is outputted. The block select signal BLK is inputted to the respective gates of an N-channel transistor T11 and a P-channel transistor T12 via an inverter 21. The above P-channel transistor T12 is turned ON when the above block select signal BLK is High and the block thereof is selected, so as to apply the voltage of the above power source Vcc, which is different from the increased-voltage power source, to the respective gates of the second transistors T10 of all the word-line-resetting-ability regulating transistors 3 belonging to the block thereof, thereby bringing the word-line-resetting-ability regulating transistors 3 into a low-impedance state and enhancing their word-line resetting abilities. On the other hand, since the N-channel transistor T11 is connected to an output terminal of the above low-voltage generating circuit 5, it is turned OFF when the above block select signal BLK is Low and the block thereof is not selected, so as to apply the set low voltage VTT of the above low-voltage generating circuit 5 to the respective gates of the second transistors T10 of all the word-line-resetting-ability regulating transistors 3 belonging to the block thereof, thereby bringing the word-line-resetting-ability regulating transistors 3 into a high-impedance state and reducing their word-line resetting abilities. Thus, the resetting-ability control circuit 4 collectively controls the gate voltages VGLEAK of the second transistors T10 of the word-line-resetting-ability regulating transistors 3 in each one of the blocks 10 serving as a unit.

As shown in FIG. 3, the above block-select address signals RA3 and RA4 are generated from four AND circuits 31 which receive a control signal from a control circuit 30 for block-select address signal. As shown in the timing sequence of FIG. 4, during the interval between the time point B immediately before the initiation (represented by the mark A in the drawing) of the sensing operation by a bit line and the time point D after the completion C of the sensing operation by the above bit line, i.e., during the period during which the unselected word lines 2 have a high possibility of suffering from noise, the above control circuit 30 for block-select address signal generates the block-select address signal so as to drive the block select signal BLK to be High, thereby applying the voltage Vcc of the power source different from the increased-voltage power source as the gate voltage VGLEAK to the respective second transistors T10 of the word-line-resetting-ability regulating transistors 3.

The address signals RA1 and RA2 for row decoder are generated from four AND circuits which receive a control signal from a control circuit 32 for row-decoder address signal.

In the low-voltage generating circuit 5 of FIG. 1, a reference numeral 6 designates a reference-voltage generating circuit (power source having a high impedance) for generating the set low voltage VTT. The reference-voltage generating circuit 6 is composed of: an N-channel transistor T17 diode-connected to the ground; and a P-channel transistor T18 having a high impedance connected to the voltage Vcc of the power source different from the increased-voltage power source, which have been connected in series.

In the above low-voltage generating circuit 5, a reference numeral 7 designates a charge withdrawing circuit for reducing the potential of the output terminal to the level of the set low voltage VTT. The above charge withdrawing circuit 7 comprises: a reference-voltage generating portion 8 consisting of two transistors T13 and T14 for generating the same potential as that of the above reference-voltage generating circuit 6; a differential amplifier 9 for receiving a voltage generated from the reference-voltage generating portion 8 and the voltage of the output terminal; a transistor T16 controlled by the output from the differential amplifier 9; and another transistor T15. Consequently, when the above resetting-ability control circuit 4 reduces the gate voltages VGLEAK of the second transistors T10 of the word-line-resetting-ability regulating transistors 3 from the potential of the power source Vcc different from the increased-voltage power source to the set low voltage VTT of the low-voltage generating circuit 5, the transistor T16 of the charge withdrawing circuit 7 is turned ON by the output from the differential amplifier 9 so that the output terminal is connected to the ground, thereby swiftly withdrawing surplus charges from the output terminal.

FIG. 1, a reference numeral 15 designates a timing control circuit which receives the activate signal/RAS to the semiconductor memory device and generates a low-voltagegenerating-circuit control signal VTTCTRL, thereby halting the operation of the differential amplifier 9 and turning OFF the transistor T15 after a given period of time has elapsed from the time at which the gate voltage VGLEAK of the second transistor T10 of the word-line-resetting-ability regulating transistor 3 was reduced from the potential of the power source VCC, different from the increased-voltage power source, to the set low voltage VTT.

In the above low-voltage generating circuit 5, a reference numeral 17 designates a starting-up circuit, which is connected to the power source Vcc different from the increased-voltage power source and comprises: two transistors T21 and T22 each having a low impedance; and a transistor T19 which is turned ON in response to a power-on reset signal POR. The starting-up circuit 17 accelerates the rising of the output potential of the low-voltage power-source circuit 5 at power-on.

Thus, in the above embodiment, the activate signal /RAS is inputted as shown in the timing sequence of FIG. 4, which generates the block select signal BLK based on the block-select address signals RA3 and RA4. Then, the voltage from the power source Vcc different from the increased-voltage power source is applied as the gate voltage VGLEAK to the respective second transistors T10 of all the word-line-resetting-ability regulating transistors 10 belonging only to the selected active block 10, while the other inactive blocks 10 remain in the state in which the word-line resetting abilities are low with the continuous application of the set low voltage VTT. This is because consideration has been given to the fact that, since sensing operation is not performed in the region of the inactive blocks 10, the word lines 2 are free from noise so that it is not necessary to increase the word-line-resetting abilities there.

In view of the foregoing, each of the word-line-resetting-ability regulating transistor 3 in the present embodiment is composed of the first and second transistors T9 and T10, so that the gate voltage VGLEAK of the second transistor T10 is controlled to be at the voltage value Vcc (<Vpp) of the power source different from the increased-voltage power source. Consequently, the word-line-resetting-ability regulating transistor 3 is brought into a higher-impedance state than in the case where the gate voltage VGLEAK is controlled to be at the voltage value Vpp of the increased-voltage power source. As a result, a current uselessly flowing through the short-circuited portion of a word line and a bit line during standby can be suppressed to a great degree and an operating current can be more suppressed than in the case where the increased-voltage power source, which presents a low voltage-generating efficiency, is used as a driving power source (i.e., a DRAM operable with a low voltage using an increased-voltage power source for driving the row decoder), thereby reducing power consumption.

In the present embodiment, the block select signal BLK is used to control the second transistors T10 of the word-line-resetting-ability regulating transistors 3 belonging only to the selected active block 10, thereby enhancing only the resetting abilities of the word lines in the selected block 10. As for the word-line-resetting-ability regulating transistors 3 in the other inactive blocks 10, they are controlled remain in the state in which the word-line-resetting-ability is restrained by continuously applying the set low voltage VTT, so that the number of transistors required for charging and discharging the gates of the word-line-resetting-ability regulating transistors 3 can be reduced to ⅛ to ¹⁄₁₆ (varying depending on the refresh cycle) of the number required in the case of using a conventional 16M DRAM, e.g., thereby achieving a further reduction in power consumption.

In the present embodiment, the set low voltage VTT to be used as the reference is generated from the reference-voltage generating circuit 6 of the low-voltage power-source circuit 5. When the semiconductor memory device is activated, the gate potential of each of the second transistors T10 of the word-line-resetting-ability regulating transistors 3 belonging to a block selected by tile block-select address signal is switched from the level of the set low voltage VTT generated from the above low-voltage generating circuit 5 to the potential level of the power source Vcc different from the increased-voltage power source. This enhances the word-line resetting abilities of the active selected block 10 and eliminates the fluctuation of the potentials of the word lines (variations in the potentials of the word lines) due to coupling noise from the bit lines in sensing operation. When the semiconductor memory device is inactivated, the selection of the block is cancelled and the potentials of the gates of the word-line-resetting-ability regulating transistors 3 are restored to the original level of the set low voltage VTT. At this stage, charges corresponding to a difference between the potential level of the power source Vcc different from the increased-voltage power source and the above set low voltage VTT become surplus. However, the charge withdrawing circuit 7 swiftly withdraws the resulting surplus charges to the ground.

Figure 5:
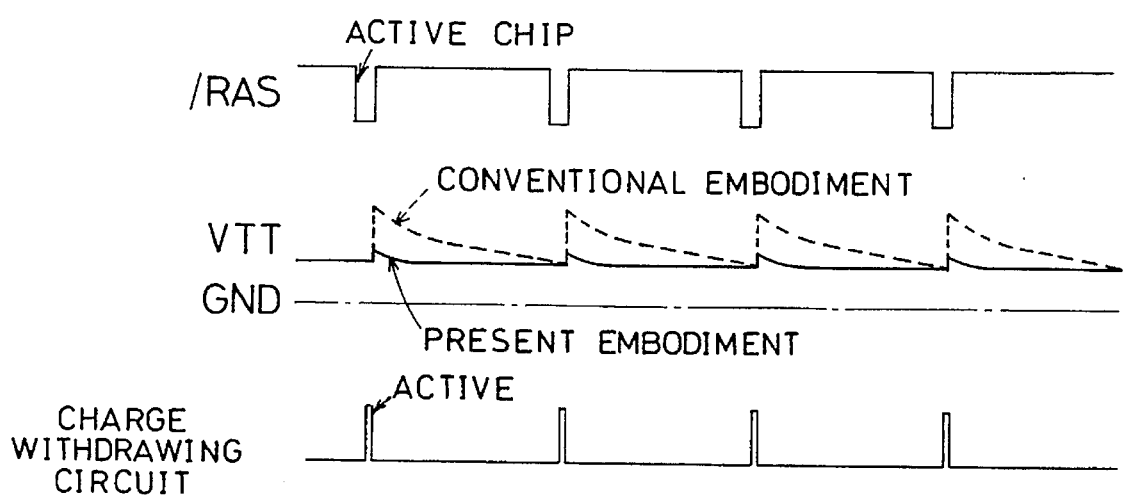
FIG. 5 is a view illustrating the operation of a charge withdrawing circuit of a low-voltage generating circuit of the first embodiment.

If consideration is given to the case where there is no charge withdrawing circuit 7, the capacitance of only the selected block 10 reaches several pF. Since the surplus charges are released only via the reference-voltage generating circuit 6 having a high impedance, the gate potential of the word-line-resetting-ability regulating transistor 3 requires a time period of several tens of μs to reach the set low voltage VTT. Since the refresh cycle of a 16M dynamic RAM with low power (e.g., 3.3 V) is 128 ms in 4K-word refresh, the semiconductor memory device can be activated in a cycle of about 31 μs in dispersed refresh. In contrast to the period of 31 μs, the period of several tens of μs is not sufficient to suppress an increase in current resulting from a short circuit between a bit line and a word line. However, in resetting the gate voltage VGLEAK of the second transistor T10 of the word-line-resetting-ability regulating transistor 8 to the value of the set low voltage VTT during standby in the present embodiment, the surplus charges are swiftly withdrawn by the charge withdrawing circuit 7 to the ground as indicated by the broken line of FIG. 5, as described above, so that the output terminal is swiftly reduced to the level of the set low voltage VTT. As a result, an increase in the current resulting from a short circuit between a bit line and a word line can be effectively suppressed even in the intermittent mode such as the slow refreshing mode or the self-refreshing mode.

At the power-on of the semiconductor memory device, the rising of the potential of the set low voltage VTT in the low-voltage generating circuit 5 requires a time period of several tens of μs only via the reference-voltage generating circuit 6 having a high impedance (on the assumption that the power-source impedance is 1 Mohm). Since the ability of the word-line-resetting-ability regulating transistor 3 is not sufficient in the mean time, a floating state may be observed in the worst case, which does not ensure the integrity of written data. In the present embodiment, however, since the starting-up circuit 17 swiftly raises the potential of the set low voltage VTT in response to the power-on reset signal POR after power-on, the integrity of data written subsequently to the power-on can be ensured. Even if the potential is slightly higher than a given level, a standby current is increased only during a short period subsequent to the power-on, so that it does not present a problem.

(Second Embodiment)

Figure 6:
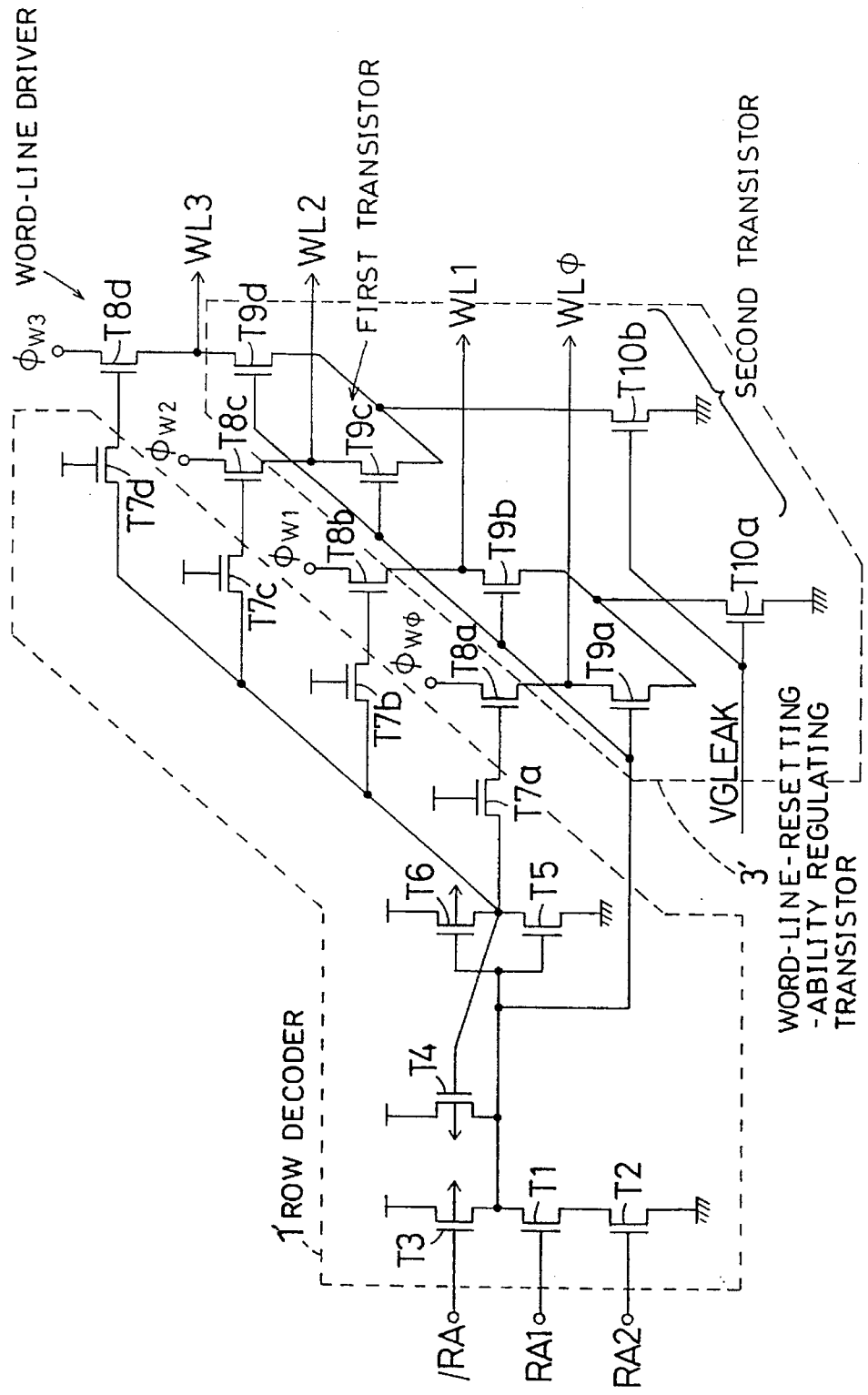
FIG. 6 is a circuit diagram showing the periphery of a row decoder of a semiconductor memory device according to a second embodiment of the present invention.

FIG. 6 shows a semiconductor storage device according to a second embodiment of the present invention.

In FIG. 6 are shown word lines WL0, WL1, WL2, and WL3.

the present embodiment, a row decoder 1' consists of transistors T1 to T6 and T7a to T7d and a word-line driver consists of four transistors T8a to T8d. Four word-line-resetting-ability regulating transistors 3' are constituted by four first transistors T9a to T9d and by two second transistors T10a and T10b. Of these transistors, the four first transistors T9a to T9d constitute a word-line resetting portion, while the two second transistors T10a and T10b constitute a word-line-resetting-ability adjusting portion.

The present embodiment is different from the above first embodiment in that four predecoded signals φw for one row decoder 1' are inputted to the corresponding word-line drivers T8a to T8d. Moreover, the first transistors T9a to T9d of the first transistors of the word-line-resetting-ability transistor 3' are collectively controlled by an output signal from the row decoder 1'. The above first transistors T9a and T9b are connected to each other on the ground side, while the above first transistors T9c and T9d are also connected to each other on the ground side, so that the first transistors T9a and T9b are connected in common to the second transistor T10a, while the first transistors T9c and T9d are connected in common to the second transistor T10b. Briefly, in the present embodiment, the two second transistors T10a and T10b are provided to be used in common by the four word-line-resetting-ability regulating transistors, which might have required the provision of four second transistors in the first embodiment.

Thus, in the present embodiment, the number of the second transistors of the word-line-resetting-ability regulating transistor 3' can be halved compared with the number of the second transistors of the word-line-resetting ability regulating transistor 3 in the first embodiment. The above circuit structure can also suppress an increase in the current resulting from a short circuit between a bit line and a word line.

However, if there is a short circuit between the word line WL0 and a bit line in the above circuit structure, the gate voltage VGLEAK of the second transistors T10a and T10b is controlled to be at the value of the set low voltage VTT during standby in order to suppress an increase in current in the short-circuited portion, so that the second transistors T10a and T10b of the word-resetting-ability adjusting transistor are in the high-impedance state. On the other hand, the first transistors T9a to T9d during standby are in the ON state due to an output signal from the row decoder 1'. Consequently, the word line WL0 is set at a bit-line precharged potential, with the result that the word line WL1 is also set at the bit-line precharged potential. This leads to the destruction of data stored in a memory cell corresponding to the word line WL0 which has been short-circuited and to the word line WL1 which has not been short-circuited. However, redundant replacement is generally performed with respect to a plurality of word lines forming a unit (two or four word lines in a unit), which include a defective one, in order to maintain data topology before and after the portion redundantly replaced or because of a restriction on the layout of the row decoder. Consequently, if one second transistor is used in common by the word-resetting-ability adjusting transistors which are equal in number to the word lines forming the unit for redundant replacement, the current during operation can be reduced without causing any effective problem, while the number of the second transistors is halved. Although each of the second transistors is used in common by two word-line-resetting-ability regulating transistor 3' in the present embodiment, if four word lines form a unit for redundant replacement, it is used in common by four word-line-resetting-ability regulating transistors 3'.

The above circuit structure also provides another advantage described below. That is, the pair of word lines WL0 and WL1 serving as the unit for redundant replacement are connected to respective memory-cell transfer gates, which are located on the opposite side of the pair of bit lines. In a semiconductor memory device of CMOS type, a sense amplifier on the Low level and a sense amplifier on the High level are activated substantially at tile same time. Consequently, coupling noises from the bit lines to the word lines WL0 and WL1, which accompany the sensing operation. tend to cancel each other. Depending on a data pattern, there may be a case where one of the two word lines is continuously coupled to the bit line on the High level and the other is continuously coupled to the bit line on the Low level. However, by equalizing the rising speed and falling speed of the bit lines, it becomes possible to keep the word-line resetting abilities constantly low. Consequently, in the present embodiment, the constant set low voltage VTT is applied as the gate voltage VGLEAK to the second transistors 10a and 10b. With the structure, it is sufficient in the present embodiment to provide a low-voltage generating circuit obtained by simplifying the low-voltage generating circuit 5 of the above first embodiment. Since the timing control circuit 15 is no more necessary in the block, the present embodiment exerts the effects of further simplifying the circuit structure and further reducing the power-source current during operation.

(Third Embodiment)

Figure 7:
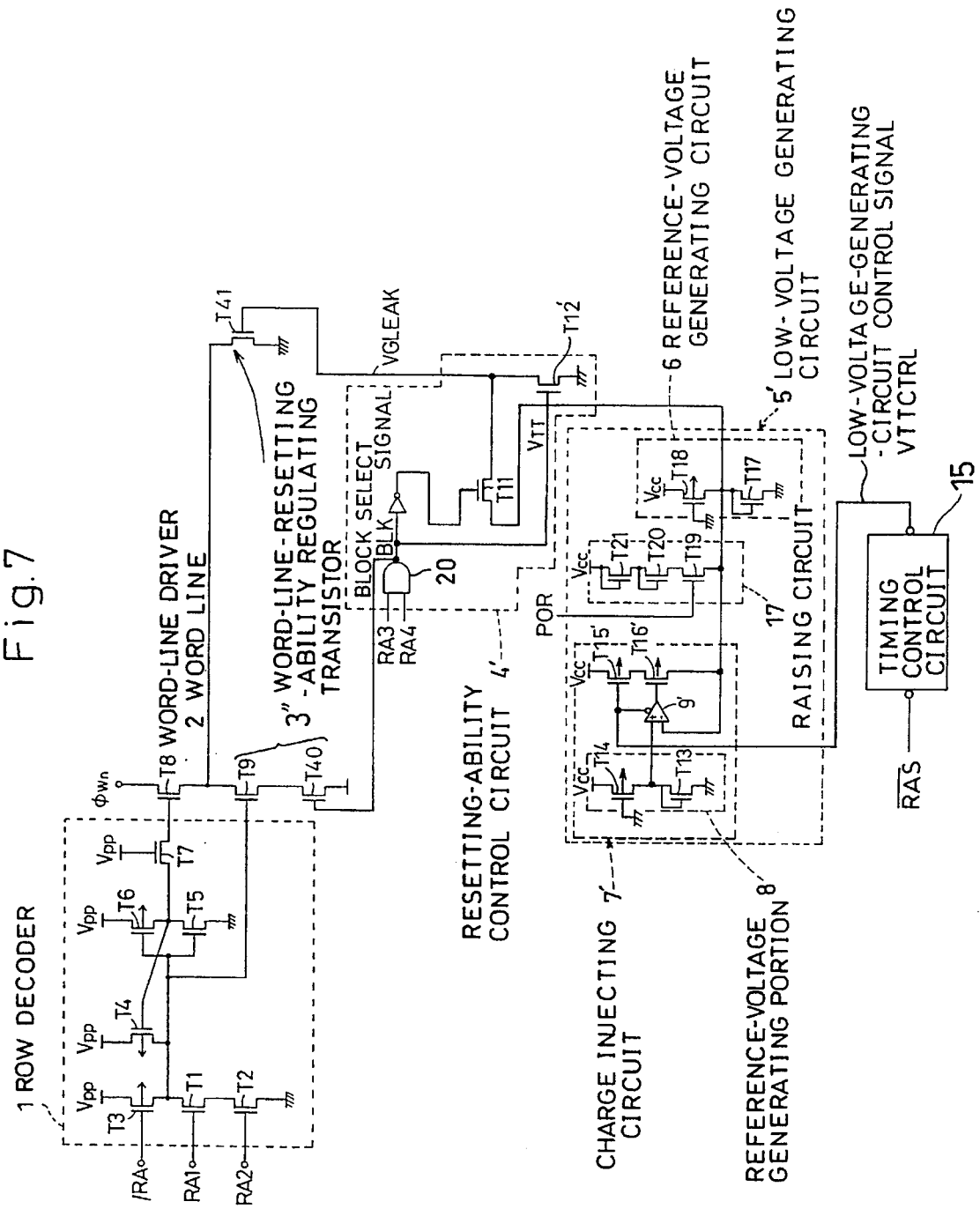
FIG. 7 is a circuit diagram showing the periphery of a row decoder of a semiconductor memory device according to a third embodiment of the present invention.

FIG. 7 shows a third embodiment of the present invention.

In the present embodiment, each of word-line-resetting-ability regulating transistors 3" consists of first, second, and third transistors T9, T40, and T41.

The first transistor T9 is identical with the above first transistor T8. The second transistor T40 is turned ON by the block select signal BLK (setting control signal) that has been inputted to its gate so as to connect the word line WL to the ground in cooperation with the first transistor T9, thereby controlling the word-line resetting ability to be increased.

On the other hand, the third transistor T41 is placed between the ground and that end (right end in FIG. 7) of the word line WL other than the end (left end in FIG. 7) to which the above second transistor T40 is placed closer. To the gate of the third transistor T41 has been inputted the output from a resetting-ability control circuit 4', which is similar to the resetting-ability control circuit 4 used in the above first embodiment. When the set low voltage VTT is applied to its gate, the third transistor T41 connects the word line WL to the ground with a high resistance. When a zero voltage is applied to its gate, the third transistor T41 is turned OFF and disconnects the word line WL from the ground.

The above resetting-ability control circuit 4' controls the third transistor T41 of the above word-line-resetting-ability regulating transistor 3" so as to reduce or eliminate the ability to reset the word line WL. However, the resetting-ability control circuit 4' is not provided with the power source Vcc different from the increased-voltage power source or with the transistor T12 shown in FIG. 1. Instead, the resetting-ability control circuit 4' is provided with a transistor T12'. The transistor T12' is placed between the gate electrode of the above third transistor T41 and the ground and controlled by the block select signal BLK. As a result, if a block to which the transistor T12' belongs is selected, it is turned ON by the block select signal BLK on the High level so as to set the gate voltage of the third transistor T41 to 0 V.

Figure 11:
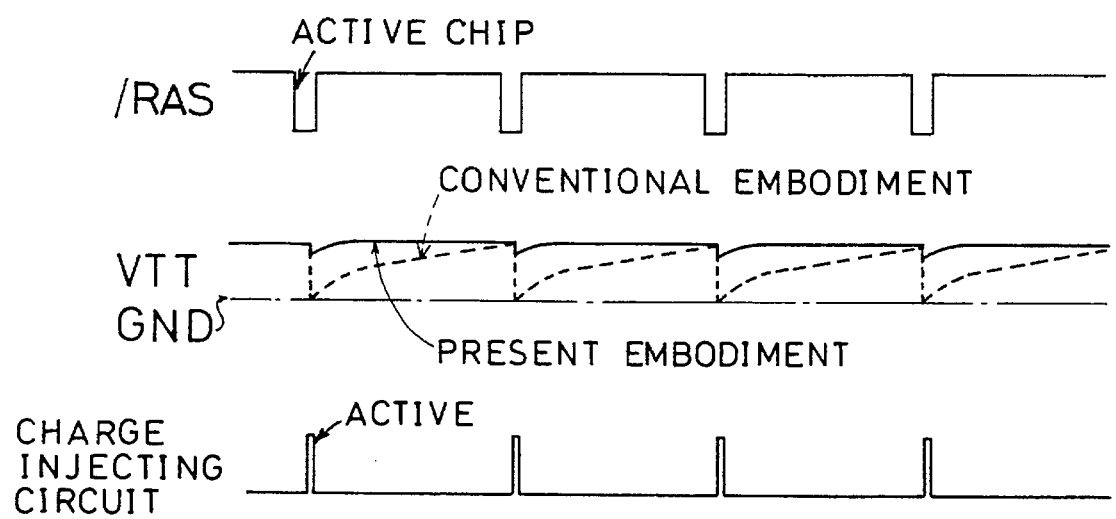
FIG. 11 is a view illustrating the operation of a charge injecting circuit of a low-voltage generating circuit of the third embodiment.

The above resetting-ability control circuit 4' receives the set low voltage VTT from a low-voltage generating circuit 5'. The above low-voltage generating circuit 5' comprises not only the reference-voltage generating circuit 6 having the same structure as that of the low-voltage generating circuit 5 and the starting-up circuit 17 of the first embodiment, but also a charge injecting circuit 7'. As shown in FIG. 11, when the above resetting-ability control circuit 4' increases the gate voltage VGLEAK of the third transistor T41 of the word-line-resetting-ability regulating transistor 3" from the ground potential to the set low voltage VTT of the low-voltage generating circuit 5', the charge injecting circuit 7' turns ON the transistor T16' with the output from a differential amplifier 9' so as to connect the output terminal to the power source Vcc different from the increased-voltage power source, thereby swiftly injecting the lacking charges into the output terminal and increasing the gate voltage VGLEAK to tile set low voltage VTT.

Consequently, in the present embodiment, the function of controlling the word-line resetting ability to be large is performed by the first and second transistors T9 and T40, while the function of controlling the word-line resetting ability to be small is performed by the third transistor T41, so that it is possible to freely determine each of the abilities (sizes) of the second and third transistors T40 and T41 without being restrained by the abilities of the other transistors.

When the semiconductor memory device is inactivated, the word lines at the potential of 0 V belonging to the block which has been selected thus far are connected to the low-voltage generating circuit 5', so that the set low voltage VTT is lowered. As a result, if the semiconductor memory device is operated in short cycles, it is assumed that the set low voltage VTT will be repeatedly lowered to a value lower than the threshold voltage of the third transistor T41, thereby bringing the word lines into the floating state. However, since the charge injecting circuit 7' of the above low-voltage generating circuit 5' initiates the injection of charges in the present embodiment, the set low voltage VTT is thereby swiftly raised, so that the above-mentioned problem will not occur.

Although the third transistor T41 is placed on the right end of FIG. 7 in the present embodiment, it is possible to alternatively place the third transistor T41 on the opposite end (left end) on which the second transistor T40 has been placed. However, since a large number of transistors including the row decoder 1 are disposed on the side on which the second transistor T40 has been placed, the third transistor T41 is preferably placed on the opposite side as in the present embodiment, in terms of facilitating layout.

(Fourth Embodiment)

Figure 8:
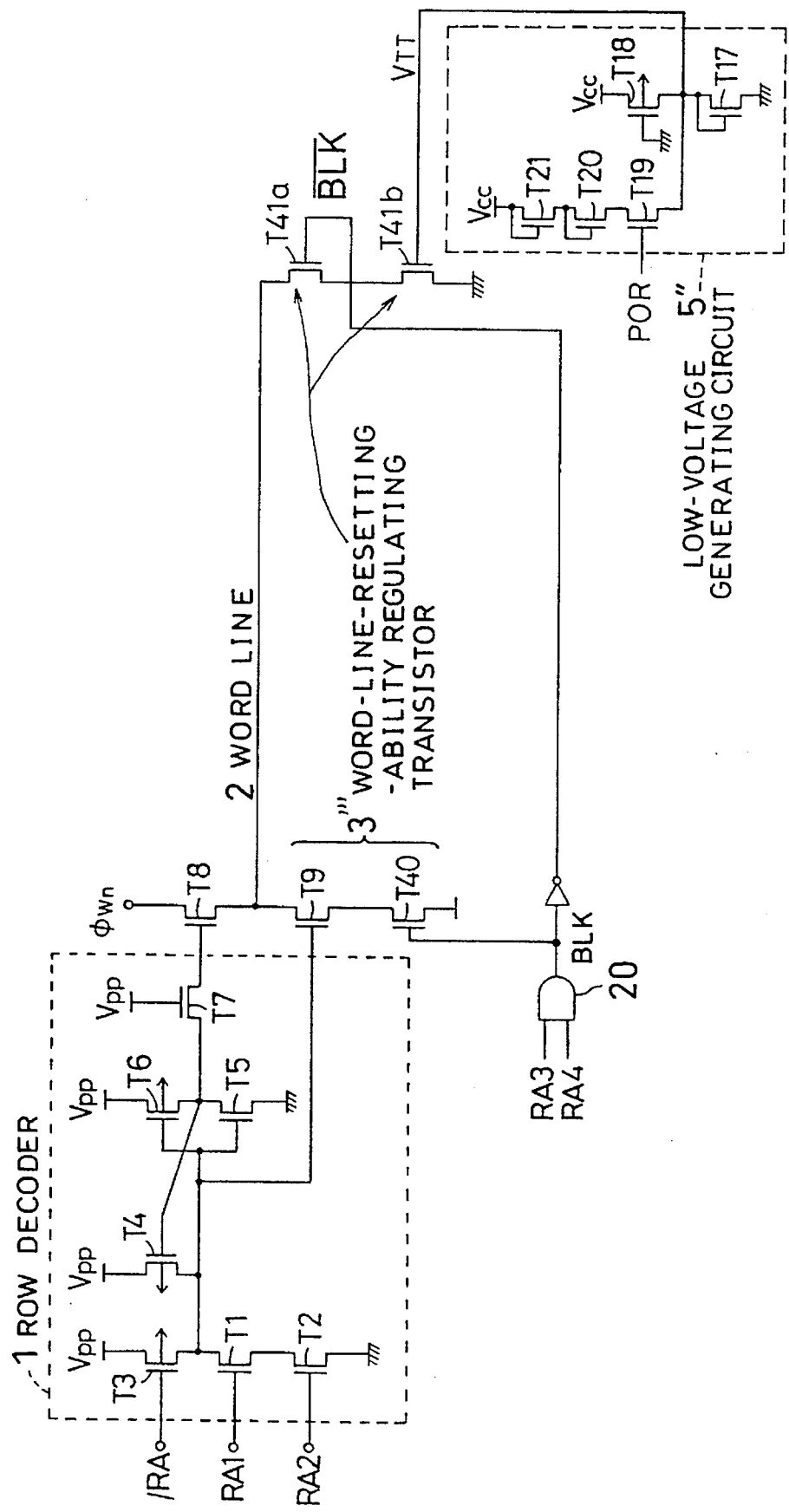
FIG. 8 is a circuit diagram showing the periphery of a row decoder of a semiconductor memory device according to a fourth embodiment of the present invention.
Figure 9A:
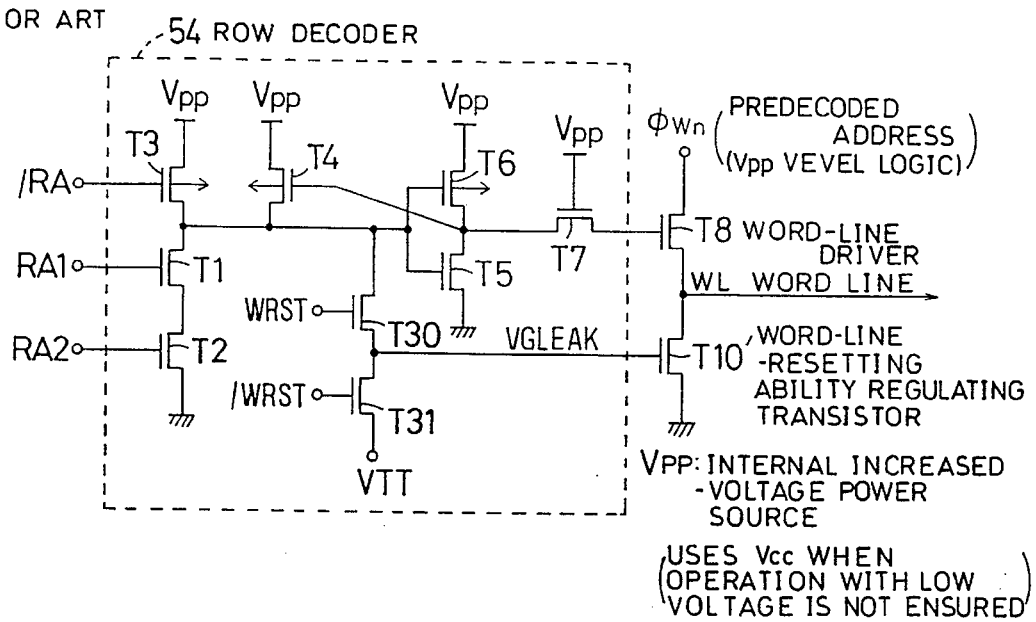
FIG. 9(a) is a circuit diagram showing the periphery of a row decoder of a conventional semiconductor memory device.
Figure 9B:
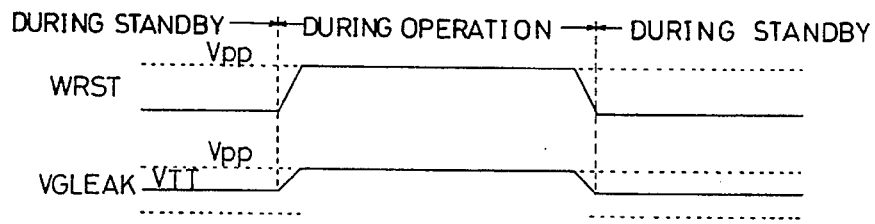
FIG. 9(b) is a view showing operating waveforms of the row decoder of the conventional semiconductor memory device during standby and during operation.
Figure 10:
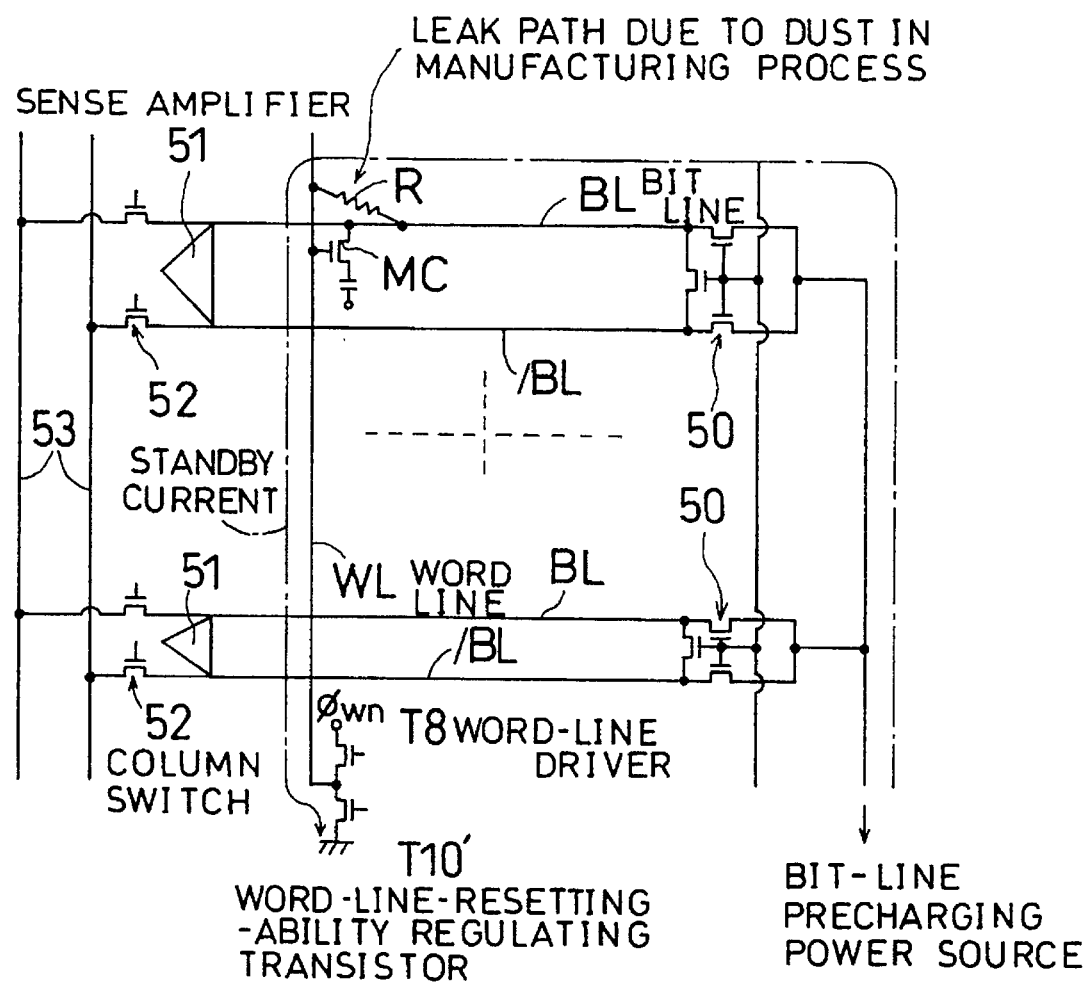
FIG. 10 is a view showing a model for an increase in standby current resulting from a short circuit between a bit line and a word line caused by dust or the like in the process of fabricating the conventional semiconductor memory device.

FIG. 8 shows a fourth embodiment of the present invention.

The present embodiment is a variation of the above third embodiment. In the present embodiment, the function of the third transistor T41 of the word-line-resetting-ability regulating transistor 3" of the above third embodiment is performed by two separate transistors T41a and T41b.

The above two third transistors T41a and T41b are connected in series between the word line WL and the ground. An inversion signal /BLK of the block select signal BLK is inputted to the gate of the third transistor T41a. The third transistor T41a is turned OFF by the inversion block select signal /BLK on the Low level (ground level) and turned ON by the block select signal BLK on the High level (voltage Vcc).

On the other hand, the fourth transistor T41b is controlled by the output from a low-voltage generating circuit 5", which is similar to the low-voltage generating circuit 5 of the above first embodiment. With the output (set low voltage VTT) from the above low-voltage generating circuit 5', the fourth transistor T41b is constantly in the ON state with a high resistance.

The above low-voltage generating circuit 5" does not have either the charge withdrawing circuit 7 of the low-voltage generating circuit 5 of the first embodiment or the charge injecting circuit 7' of the low-voltage generating circuit 5' of the third embodiment.

Consequently, in the present embodiment, the output (set low voltage VTT) from the low-voltage generating circuit 5' is inputted to the gate of the fourth transistor T41b. Since no reverse current of a high voltage exceeding the set low voltage VTT flows into the low-voltage generating circuit 5' and no charge is released from the set low voltage VTT into the low-voltage generating circuit 5', it is not necessary to provide the charge withdrawing circuit 7 or the charge injecting circuit 7', so that the present embodiment has achieved the peculiar effect of simplifying the structure of the low-voltage generating circuit 5'.

Although the increased-voltage power source for generating the increase voltage Vpp has been connected to the row decoder 1 so as to operate in the foregoing description, if it is not necessary to ensure operation with a low voltage, a power source (e.g., 3.3 V power source) which is different from the above increased-voltage power source and which generates a voltage equal to or lower than the above increased voltage Vpp may be used as the power source for the row decoder 1. In this case, a power source for generating a voltage lower than the voltage of the above 3.3 V power source and higher than the set low voltage VTT of the low-voltage power source is used as the second power source.

The present invention is also applicable to a ferroelectric memory of dynamic-sensing type.

We claim:

1. A semiconductor memory device comprising:

a large number of word lines for individually activating a large number of memory cells arranged in a matrix;

a large number of bit lines onto which data is read from said individual memory cells;

row decoders, word-line drivers, and word-line-resetting-ability regulating transistors, each for controlling respective voltages of said word lines;

a first power source serving as a power source for said row decoders;

a second power source having a voltage lower than a voltage of said first power source; and a low-voltage power source for generating a voltage lower than the respective voltages of said first and second power sources, wherein said first power source, said second power source and said low-voltage power source generate respective voltages higher than ground level, each of said word-line-resetting-ability regulating transistors is place between the corresponding word line and the ground, said semiconductor memory device further comprising a resetting-ability control circuit for controlling a gate voltage of each of said word-line-resetting-ability regulating transistors such that a resetting-ability control circuit is switched between the voltage of said second power source and a voltage of said low-voltage power source, said gate voltage determining a resetting ability of each of said word-line-resetting-ability regulating transistors to connect the corresponding word line to the ground.

2. A semiconductor memory device according to claim 1, wherein each of the word-line-resetting-ability regulating transistors is composed of first and second transistors connected in series between the corresponding word line and the ground and the resetting-ability control circuit controls said first transistor with an output signal from the corresponding row decoder and controls a gate voltage of said second transistor such that a resetting-ability control circuit is switched between the voltage of the second power source and the voltage of the low-voltage power source.

3. A semiconductor memory device according to claim 1, wherein each of the word-line-resetting-ability regulating transistors is composed of first, second, and third transistors, said first and second transistors being connected in series and connecting the corresponding word line to the ground, said third transistor connecting said word line to the ground and the resetting-ability control circuit controls said first transistor with an output signal from tile corresponding row decoder, controls a gate voltage of said second transistor such that it is switched between the voltage of said second power source and the ground voltage, and controls a gate voltage of said third transistor such that it is switched between the ground voltage and the voltage of the low-voltage power source.

4. A semiconductor memory device according to claim 1, wherein each of the word-line-resetting-ability regulating transistors is composed of first, second, third, and fourth transistors, said first and second transistors being connected in series between the corresponding word line and the ground, said third and fourth transistors being connected in series between said word line and the ground and the resetting-ability control circuit controls said first transistor with an output signal from tile corresponding row decoder, controls a gate voltage of said second transistor such that it is switched between the voltage of the second power source and the ground voltage, controls a gate voltage of said third transistor between the ground voltage and the voltage of the second power source, and controls a gate voltage of said fourth transistor such that it is fixed at the voltage of the low-voltage power source.

5. A semiconductor memory device according to claim 1, 2, 3, or 4, wherein a period during which the gate voltage of the second transistor is held at the voltage of the second power source includes an interval between a time point immediately before the initiation of sensing operation of the bit lines and the completion of the sensing operation.

6. A semiconductor memory device according to claim 1, 2, or 4, wherein each of the word-line-resetting-ability regulating transistors corresponding to the individual word lines has its second transistor used in common by a given number of plural word lines.

7. A semiconductor memory device according to claim 6, wherein the number of the word-line-resetting-ability regulating transistors having their second transistors used in common is equal to the number of the word lines belonging to one group to be redundantly replaced.

8. A semiconductor memory device according to claim 7, wherein the gate voltage of each of the second transistors used in common is fixed at the voltage of the low-voltage power source.

9. A semiconductor memory device according to claim 3, wherein the large number of memory cells and the large number of word lines are assigned to a plurality of blocks each consisting of a plurality of memory cells and a plurality of word lines corresponding thereto, said blocks comprise the respective resetting-ability control circuits, and of said resetting-ability control circuits, only one corresponding to the block containing one of the memory cells to be activated receives a block select signal and switches the gate voltage of each of the second transistors to the voltage of the second power source.

10. A semiconductor memory device according to claim 4, wherein the large number of memory cells and the large number of word lines are assigned to a plurality of blocks each consisting of a plurality of memory cells and a plurality of word lines corresponding thereto, said blocks comprise the respective resetting-ability control circuits, and of said resetting-ability control circuits, only one corresponding to the block containing one of the memory cells to be activated receives a block select signal and switches the gate voltage of each of the second transistors to the voltage of the second power source, while switching the gate voltage of each of the third transistors to the ground voltage.

11. A semiconductor memory device according to claim 5, wherein the large number of memory cells and the large number of word lines are assigned to a plurality of blocks each consisting of a plurality of memory cells and a plurality of word lines corresponding thereto, said blocks comprise the respective resetting-ability control circuits, and of said resetting-ability control circuits, only one corresponding to the block containing one of the memory cells to be activated receives a block select signal and switches the gate voltage of each of the second transistors to the voltage of the second power source, while switching the gate voltage of each of the third transistors to the ground voltage.

12. A semiconductor memory device according to claim 9, 10, or 11, wherein as the block select signal, information represented by an address signal is used.

13. A semiconductor memory device according to claim 1, 2, or 9, wherein the low-voltage power source has a power source having a high impedance for generating a set low voltage at an output terminal and a charge withdrawing circuit which is activated during a set period after the memory cells arrived in a state of inactivation so as to reduce a potential of said output terminal to said set low voltage.

14. A semiconductor memory device according to claim 1, 3, or 10, wherein the low-voltage power source has a power source having a high impedance for generating a set low voltage at an output terminal and a charge injecting circuit which is activated during a set period after the memory cells arrived in a state of inactivation so as to increase a potential of said output terminal to said set low voltage.

15. A semiconductor memory device according to claim 13, wherein the low-voltage power source further has a starting-up circuit having a low impedance for raising, at power-on, the potential of the output terminal to the set low voltage.

16. A semiconductor memory device according to claim 1, 2, 3, or 4, wherein the first power source is an internal increased-voltage power source and the second power source is a power source different from said internal increased-voltage power source, said second power source generating a voltage lower than an increased voltage of said internal increased-voltage power source.

17. A semiconductor memory device comprising:

a large number of word lines for individually activating a large number of memory cells arranged in a matrix;

a large number of bit lines onto which data is read from said individual memory cells;

row decoders, word-line drivers, and word-line-resetting-ability regulating transistors, each for controlling respective voltages of said word lines;

a first power source serving as a power source for said row decoders; and a low-voltage power source for generating a voltage lower than a voltage of said first power source, wherein each of said word-line-resetting-ability regulating transistors is placed between the corresponding word line and the ground and a gate voltage of each of said word-line-resetting-ability regulating transistors is switched between an output signal from said row decoder having a voltage of said first power source and a voltage of said low-voltage power source, said gate voltage determining a resetting ability of each of said word-line-resetting-ability regulating transistors to connect the corresponding word line to the ground, said low-voltage power source having a power source having a high impedance for generating a set low voltage at an output terminal and a charge withdrawing circuit which is activated during a set period after the activation of one of said memory cells was completed and which reduces the potential of said output terminal to said set low voltage.

18. A semiconductor memory device comprising:

a large number of word lines for individually activating a large number of memory cells arranged in a matrix;

a large number of bit lines onto which data is read from said individual memory cells;

row decoders, word-line drivers, and word-line-resetting-ability regulating transistors, each for controlling respective voltages of said word lines;

a first power source serving as a power source for said row decoders; and a low-voltage power source for generating a voltage lower than a voltage of said first power source, wherein each of said word-line-resetting-ability regulating transistors is placed between the corresponding word line and the ground and a gate voltage of each of said word-line-resetting-ability regulating transistors is switched between an output signal from said row decoder having a voltage of said first power source and a voltage of said low-voltage power source, said gate voltage determining a resetting ability of each of said word-line-resetting-ability regulating transistors to connect the corresponding word line to the ground, said low-voltage power source having a power source having a high impedance for generating a set low voltage at an output terminal and a charge injecting circuit which is activated during a set period after the activation of one of said memory cells was completed and which increases the potential of said output terminal to said set low voltage.

19. A semiconductor memory device according to claim 17 or 18, wherein the low-voltage power source further has a starting-up circuit having a low impedance for raising, at power-on, the potential of the output terminal to the set low voltage.

\* \* \* \* \*

UNITED STATES PATENT AND TRADEMARK OFFICE
CERTIFICATE OF CORRECTION

PATENT NO. : 5,602,784
DATED : February 11, 1997
INVENTOR(S) : Makoto KOJIMA et al.

It is certified that error appears in the above-identified patent and that said Letters Patent is hereby corrected as shown below:

Col. 15, line 46, change "tile" to --the--.

Signed and Sealed this

Third Day of March, 1998

Attest:

BRUCE LEHMAN

*Attesting Officer*  *Commissioner of Patents and Trademarks*